US007705335B2

(12) United States Patent
Workman et al.

(10) Patent No.: US 7,705,335 B2
(45) Date of Patent: Apr. 27, 2010

(54) SECURITY PROTECTION DEVICE AND METHOD

(75) Inventors: Herschel Ellis Workman, Spencer, IN (US); Cai Lin Wang, Bloomington, IN (US); Dorina Magdalena Chipara, McAllen, TX (US); Craig R. Kline, Linton, IN (US)

(73) Assignee: PartTec, Ltd., Bloomington, IN (US)

( * ) Notice: Subject to any disclaimer, the term of this patent is extended or adjusted under 35 U.S.C. 154(b) by 295 days.

(21) Appl. No.: 12/075,827

(22) Filed: Mar. 14, 2008

(65) Prior Publication Data

US 2009/0224185 A1 Sep. 10, 2009

Related U.S. Application Data

(60) Provisional application No. 60/918,441, filed on Mar. 16, 2007.

(51) Int. Cl.
*G21F 5/00* (2006.01)
*H01L 27/146* (2006.01)

(52) U.S. Cl. ............ 250/518.1; 250/515.1; 250/370.09; 70/332; 70/333 R; 70/416

(58) Field of Classification Search ............ 250/370.01, 250/370.02, 370.08, 370.09, 482.1, 515.1, 250/518.1, 526; 70/332, 333 A, 333 R, 416, 70/417, 442; 976/DIG. 43
See application file for complete search history.

(56) References Cited

U.S. PATENT DOCUMENTS

| | | | | | |
|---|---|---|---|---|---|
| 2,938,374 | A * | 5/1960 | Criscuolo et al. | ......... | 70/333 R |
| 2,970,217 | A * | 1/1961 | Enikeieff | ................. | 250/515.1 |
| 3,024,640 | A * | 3/1962 | Miller | ......................... | 70/332 |
| 3,476,939 | A * | 11/1969 | Bettens et al. | ........... | 250/506.1 |
| 3,983,727 | A * | 10/1976 | Todd | ........................... | 70/323 |
| 4,599,515 | A * | 7/1986 | Whittemore | ............. | 250/390.1 |
| 4,648,255 | A | 3/1987 | Gartner | | |
| 4,686,842 | A | 8/1987 | Chen | | |
| 4,776,190 | A * | 10/1988 | Miller et al. | .............. | 70/303 A |
| 4,796,446 | A * | 1/1989 | Miller et al. | .................. | 70/316 |
| 4,803,859 | A * | 2/1989 | Miller et al. | .................. | 70/323 |
| 5,236,101 | A | 8/1993 | Dugmore | | |
| 7,003,988 | B2 | 2/2006 | Yu | | |
| 7,293,439 | B1 | 11/2007 | Miao | | |
| 7,476,874 | B2 * | 1/2009 | Patel | ....................... | 250/484.5 |
| 2004/0124374 | A1 | 7/2004 | Joseph | | |
| 2005/0156045 | A1 | 7/2005 | Steffen | | |
| 2007/0056339 | A1 | 3/2007 | Irgens et al. | | |

OTHER PUBLICATIONS

International Searching Authority. PCT International Search Report and Written Opinion of the International Searching Authority, PCT/US2008/006315, Aug. 20, 2008.

* cited by examiner

*Primary Examiner*—Bernard E Souw
(74) *Attorney, Agent, or Firm*—Krieg DeVault LLP

(57) ABSTRACT

A method, device and retrofitting kit is disclosed that will protect materials that are housed within a storage device from one or more forms of radiographic imaging. A target subject is at least partially covered with a first and second layer of radiographic cloaking material. The first layer of radiographic cloaking material is configured to defeat a first type of radiographic beam, such as a photon beam. The second layer of radiographic cloaking material is configured to defeat a second type of radiographic beam, such as a particle beam.

33 Claims, 4 Drawing Sheets

SECURITY PROTECTION DEVICE AND METHOD

CROSS REFERENCE TO RELATED APPLICATION

The present application is based upon and claims priority to U.S. provisional patent application Ser. No. 60/918,441, filed on Mar. 16, 2007 entitled Security Protection Device and Method.

BACKGROUND

The present invention relates generally to radiographic imaging of storage devices and more particularly, to a method and device for protecting a storage device from radiographic imaging.

Security devices are available which, if their inner workings could be discovered, would be ineffective and therefore would no longer prevent undetected, unauthorized discovery of objects they are designed to secure. An example is a mechanical combination lock which, if the position of its various internal components could be ascertained, would allow unauthorized access. In addition, it is also important in some instances to prevent unwanted radiographic imaging of a storage device so that its contents cannot be ascertained. The current art of radiographic imaging has significantly increased the possibility of this type of intrusion into areas protected by such high security devices. Other types of locks, closures, fasteners, and bolts that protect by mechanically restricting access and which are themselves assumed secured because of the inability of an intruder to ascertain the position of their locking mechanism are also vulnerable to radiographic imaging.

SUMMARY

One embodiment of the present application discloses a storage device that is cloaked by two layers of radiographic cloaking material. Another embodiment discloses a method of cloaking a lock of a storage device with multiple layers of radiographic cloaking material. Yet another embodiment discloses a kit for retrofitting existing lock mechanisms of storage devices. Other embodiments include unique apparatus, devices, systems, and methods for cloaking the internal components and contents of a storage device. Further embodiments, forms, objects, features, advantages, aspects, and benefits of the present application shall become apparent from the detailed description and figures included herewith.

BRIEF DESCRIPTION OF THE DRAWINGS

The figures are not necessarily to scale, emphasis instead being placed upon illustrating the principles of the invention. Moreover, in the figures, like reference numerals designate corresponding parts throughout the different views.

DETAILED DESCRIPTION

Figure 1:
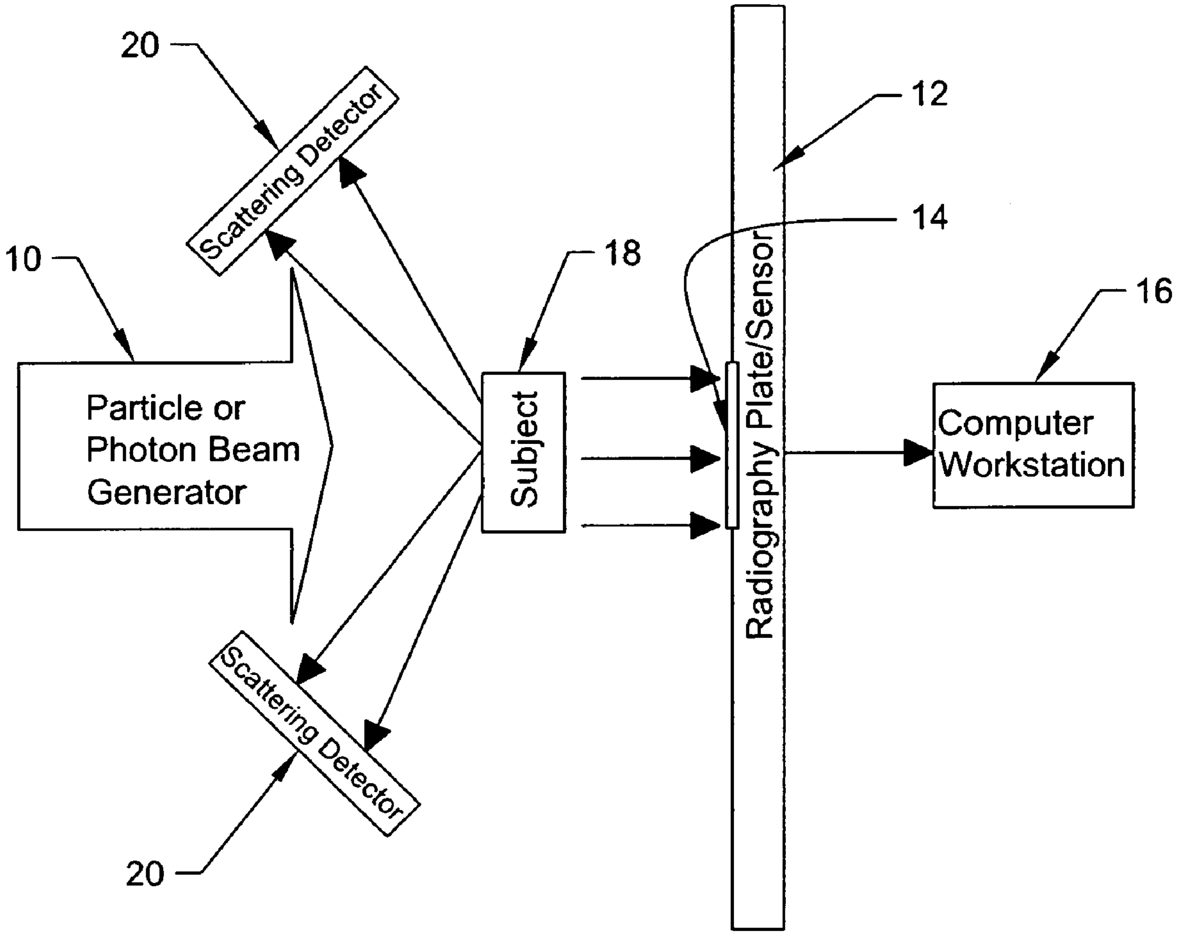
FIG. 1 is a diagram of an illustrative radiographic imaging system directed toward a target subject.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device, and such further applications of the principles of the invention is illustrated therein being contemplated as would normally occur to one skilled in the art to which the invention relates.

Referring to FIG. 1, a representative radiographic imaging system is illustrated that includes a particle or photon beam generator 10. Radiography, the art of producing images of materials from beams of photons (e.g.—gamma rays and x-rays), particles (e.g.—neutrons), and other electromagnetic waves, generally rely upon a source of such radiation, such as particle or photon beam generator 10 and a detector 12. Radiation sources for imaging include gamma rays, X-rays, neutron beams, proton beams, and electron beams.

Data collection from detectors 12 is interpreted and presented in a human-recognizable format as an image 14. Typical detectors 12 include X-ray or gamma ray plates, computed radiography ("CR") plates, semiconductor detectors, scintillator-based detectors and others. Images 14 are then either presented directly from the detector surface as in the case of X-ray or gamma ray plates or the data is gathered from detector 12 by a computer workstation 16 that is connected with a CR plate 12 and a representation of the image 14 is presented on a computer screen of workstation 16.

As illustrated in FIG. 1, generator 10 generates a photon beam and/or a particle beam that is directed towards a target subject 18. In the present application, target subject 18 is in the form of a storage device or container or a component of a storage device or container such as a lock. In one form, storage device comprises a safe, a briefcase, a file storage device, a carrying case, a container, a lock of any of the above-referenced devices (e.g.—combination lock, pin tumbler lock, padlock, warded lock), or any other item or device that can be used to store or secure items that need to be secured from unwanted viewing or access. As set forth in greater detail below, the present application provides protection from unwanted viewing via cloaking materials that are configured to defeat radiographic images from being taken that would otherwise allow unwanted viewing of either materials contained in the storage device or a lock mechanism used to secure the storage device 18.

Another type of detector that may be utilized to detect material or devices contained in target subject 18 is a backscatter detector 20. In this form, an X-ray or gamma ray beam is directed from photon beam generator 10 toward target subject 18. Backscatter detector 20 is configured to produce an image of the internal contents of target subject 18 based on radiation that comes back from target subject 18. In physics, this is referred to as Compton scattering or the Compton effect. Once again, as set forth in detail below, the present application provides a device and method of defeating these types of images from being taken as it relates to target subject 18.

For the purpose of the present application, it is important to gain a general understanding of radiographic imaging. Radiographic imaging includes three broad categories or methods. First, there is a method which produces onto detector 12 a shadow image of the subject 18 that is being imaged. This method relies upon the contents of the subject 18 to absorb some portion of the beam at a rate that is statistically different than the absorption rate of materials adjacent to it. For example, a shadow image of a wooden pencil may be obtained from an X-ray beam that passes through the pencil and then onto an X-ray plate because the center of the pencil (i.e. —the pencil lead) will absorb the X-ray beam at a different rate, statistically, than will the surrounding wood.

A more commonly understood and used method of imaging, photographic imaging, relies upon reflection of a low-energy photon beam from the surface of the subject onto a detector plate, such as photographic film. For this type of imaging, in our example only the surface of the pencil would be imaged because the pencil's core will absorb any photons that are not reflected. Therefore, there is no reason to place a detector beyond the pencil as no photons will pass through the pencil in this type of imaging.

Backscatter X-ray imaging is a newer imaging system that detects the radiation that comes back from the target subject 18. The resolution of the resulting images is quite high. For example, some backscatter X-ray scanners are able to penetrate up to 30 cm (about 12 inches) of solid steel. As such, this type of imaging is being used to search containers and trucks, for example, because it is much quicker than physically searching items contained in the storage device. In addition to these benefits, technology also exists to scan target subjects 18 as far as 50 meters away from the beam generator 10, thereby producing 3D images of the contents of the storage device or target subject 18 that can also provide characteristics of the contents molecular components. In comparison to X-rays typically used in medical applications, backscattered X-rays are high energy and scatter instead of penetrating entirely through the target subject 18.

Another form of radiography makes use of the ballistic nature of particles (i.e. —their electrical properties (except for neutrons)) and the by-products of their interactions with matter. Methods using particle beams produced by particle beam generator 10 are very sophisticated and can develop extensive data about subject materials including shape, molecule positioning and atomic components. Much work is being performed to perfect these detectors for the purpose of scanning large containers for dangerous materials such as high energy radiation sources, explosives, and even illegal drugs. Detectors 12 for these images also fall into either the shadow type or the scattering type.

The present application is directed toward devices, methods, and retrofitting existing devices to thwart the detection of contents of target subjects 18 by producing radiographic images of the same, including lock mechanisms contained on target subjects 18 that are used to keep the target subjects 18 in a secure locked state. In particular, the application discloses the placement of material that will first, absorb as much of the incident beam generated by beam generator 10 as possible, second, scatter as much of the beam as possible and third, produce false images that camouflage the shape of the target subject 18. In order to absorb photons or particles contained in beams generated by generator 10 the material chosen must be matched to the type of beam so that the highest possible absorption cross-section is obtained. Unfortunately, the material that is chosen, for example, to absorb neutrons from a particle beam generator do not absorb, to any great degree, gamma radiation or X-ray radiation generated by a photon beam generator and vice versa. As such, the present application discloses the use of multiple materials to accomplish the purpose of defeating a plurality of different types of radiographic imaging techniques.

Figure 2:
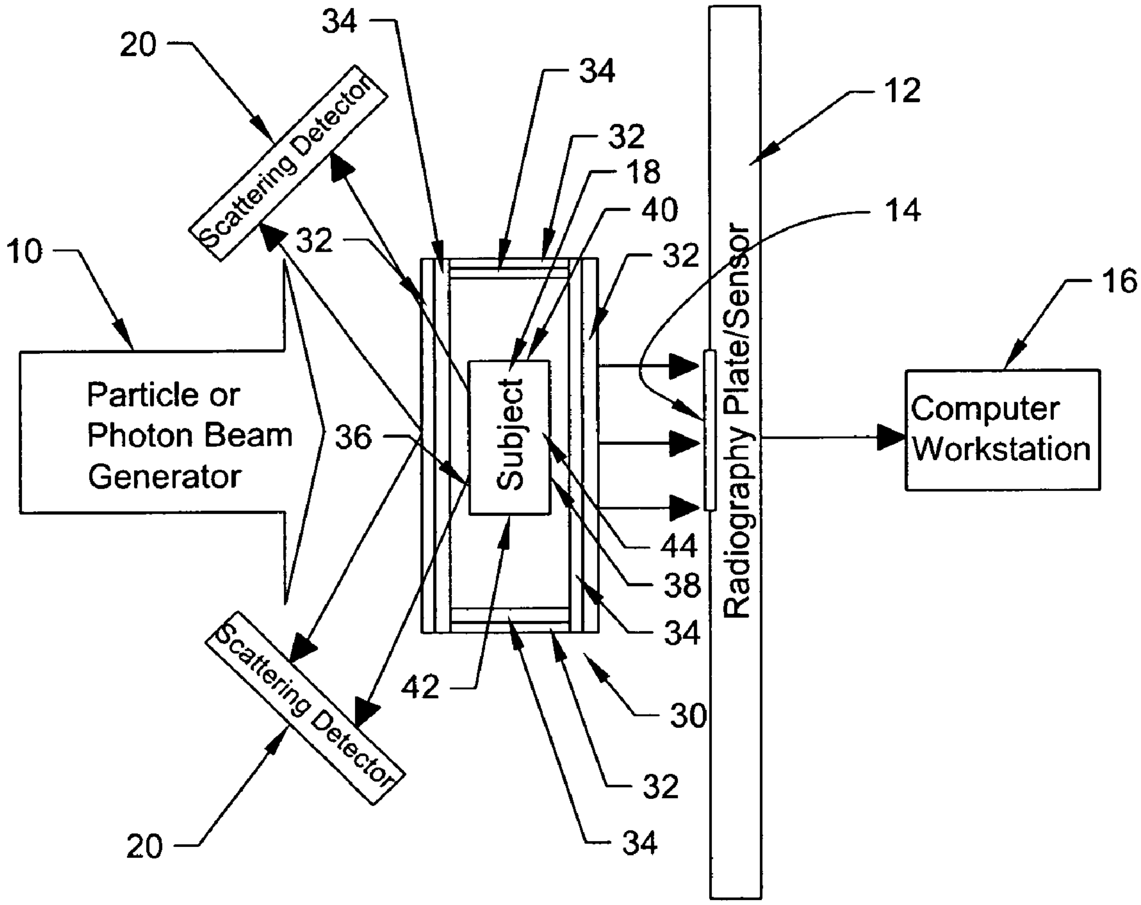
FIG. 2 is a diagram of the radiographic imaging system with a target subject cloaked by a cloaking barrier.

Referring to FIG. 2, in one form, target subject 18 is at least partially or totally covered or surrounded by a radiographic cloaking barrier 30. Cloaking barrier 30 includes a first layer of cloaking material 32 and a second layer of cloaking material 34. In one form, cloaking barrier 30 covers a front surface 36, a back surface 38, a top surface 40, a bottom surface 42 and respective side surfaces 44 of target subject 18. As such, in this form, cloaking barrier 32 surrounds or encompasses the entire surface area of target subject 18. In other forms, cloaking barrier 30 covers at least a portion of the respective surfaces of target subject 18.

As illustrated, the present application discloses the use of multiple layers of cloaking material 32, 34 that are configured to defeat radiographic imaging. Although not illustrated in this form, it should be appreciated that in other forms the materials can be combined into a single layer and then strategically positioned to prevent the beam from beam generator 10 from being able to accurately produce radiographic images of target subject 18. Further, although two layers of material are illustrated in this form, it should also be appreciated that in other forms two or more layers of cloaking material may be utilized.

In one form, the first layer of cloaking material 32 comprises a neutron defeat material or neutron poison that is configured to absorb neutrons. The layer of neutron defeat material may be selected from a group of materials consisting of a material composed of a high concentration of boron and hydrogen, boron, tritium, cadmium, gadolinium, boron loaded polyethylene, discrete chips of solid material (e.g.—polyethylene or a cured resin) containing hydrogen and particles of boron carbide, boron carbide, borated stainless steel, gadolinium-stainless steel alloys, and Nickel-Gadolinium. In addition, the first layer of cloaking material 32 can also be made from many types of plastic, which also act as a good neutron shield. As such, the layer of neutron defeat material is configured to camouflage or otherwise conceal the contents of target subject 18 from particle beams directed toward target subject 18 by particle beam generator 10.

The second layer of cloaking material 34 comprises a radiation defeat material that is configured to absorb or attenuate X-ray and/or gamma radiation. In one form, the second layer of cloaking material 34 comprises a material consisting of a high concentration of tungsten atoms or lattice. Other materials or elements that may be used to absorb or attenuate X-rays and gamma rays, and thereby provide a distorted or camouflaged radiographic image, comprise lead, depleted uranium, barium sulfate, high mass-density materials (high atomic numbered (Z) materials), and composite materials consisting of high mass-density materials. In one form, the second layer of cloaking material 34 comprises a housing containing an X-ray contrast medium that may contain, for example, iodine or barium. X-ray contrast mediums are typically liquid or fluid mediums that are configured to create a bright response on detectors 12, which in the present application, would camouflage or conceal target subject 18 thereby producing a false image.

Figure 3:
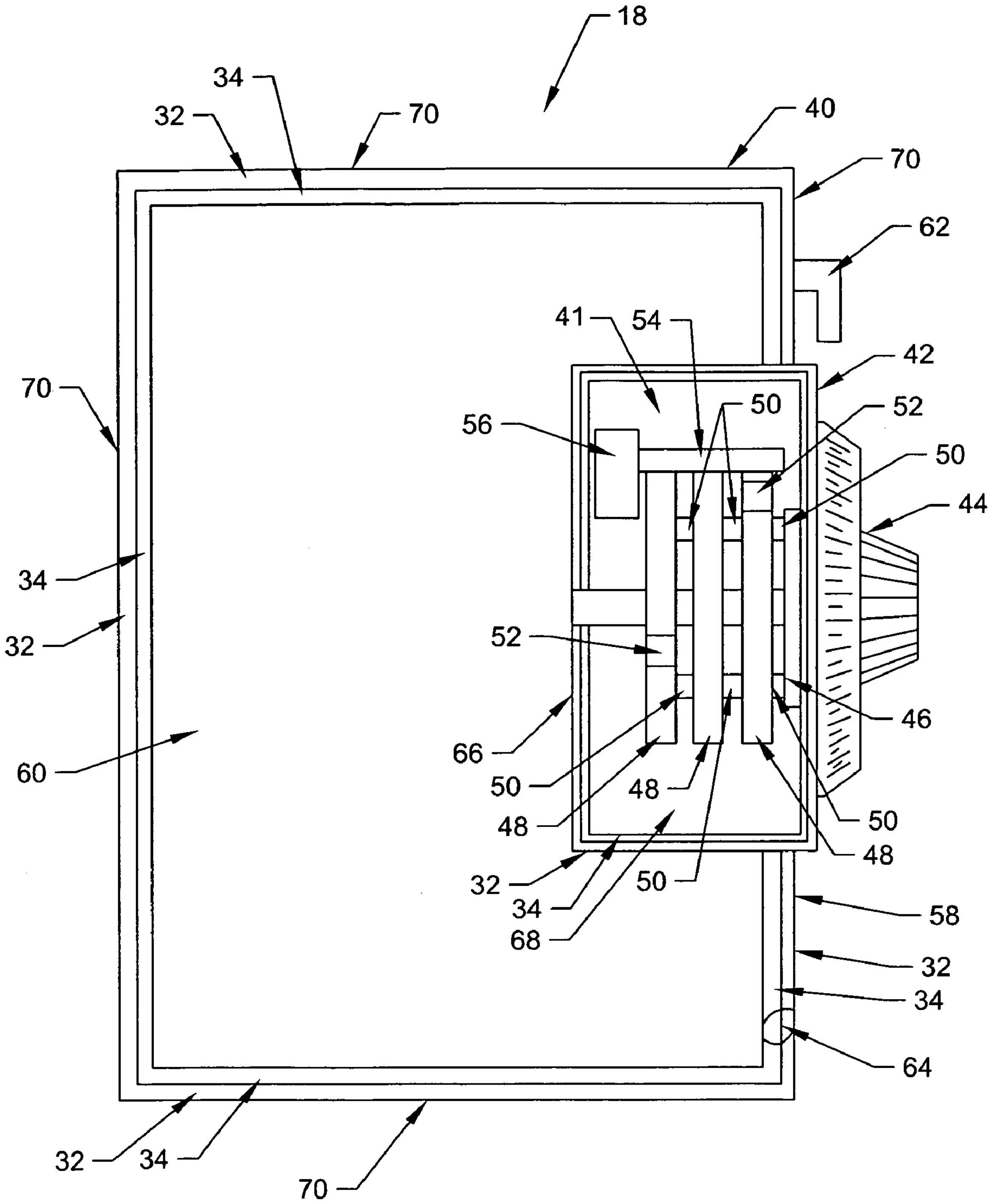
FIG. 3 illustrates a cross-sectional view of a representative storage device having a lock.

Referring to FIG. 3, a cross-sectional view of a representative target subject 18 is illustrated that comprises a storage device 40, which is illustrated as a safe in this form, having a lock 42. As previously set forth, storage device 40 can take several forms such as a safe, a briefcase, a file storage device, a carrying case, a container, or any other item or device that can be used to store or secure items that need to be protected from unwanted viewing or access or simply for the purpose of transportation. Although the representative lock 42 is illustrated as a combination lock, it should be appreciated that any type of mechanical lock could be used such as a pin tumbler lock, padlock, and warded lock.

Lock 42 includes a locking mechanism 41 that includes a numbered combination dial 44 that serves as a user interface to storage device 40. Dial 44 is positioned on an external surface of lock 42 and/or storage device 40. Rotation of dial 44 causes a drive cam 46 to engage a series of rotating cams or wheels 48. Detents 50 extending from each of the wheels 48 engage each other to cause the wheels 48 to rotate together. By rotating dial 44 to successive predetermined positions identified by numbers on the dial 44, a notch or recess 52 in each of the wheels 48 is brought into alignment with a latch or fence 54 forced into a locked position by an outer periphery of the wheels 48. When all of the notches 52 are aligned with the fence 54, the fence 54 is permitted to bias or spring into the aligned notches 52, allowing a connected locking member 56 to move out of locking engagement with a door 58 of storage device 40.

Once the locking member 56 moves out of locking engagement with the door 58 of the storage device 40, a user can gain access to an interior cavity or storage compartment 60 of the storage device 40. Typically, a latch 62 attached to the door 58 is used to open the door to obtain access to the storage compartment 60. One or more hinges 64 allow the door 58 to pivot between open and closed positions.

Locking mechanism 41 is contained within a housing 66 that defines an interior chamber 68 that houses or completely surrounds the internal components of locking mechanism 41. As illustrated, housing 66 of lock 42 includes a first layer of cloaking material 32 and a second layer of cloaking material 34. As previously set forth, the first layer of cloaking material 32 is configured to defeat a first type of radiographic beam. In this form, cloaking material 32 is configured to defeat a particle beam that is generated by a particle beam generator 10.

The second layer of cloaking material 34 is configured to defeat a second type of radiographic beam. As such, in this form, cloaking material 34 is configured to defeat photon beams that are generated by a photon beam generator 10. As such, locking mechanism 41 is protected from radiographic imaging by first and second layers of cloaking material 32, 34, thereby preventing a potential intruder from being able to determine the position of notches 52 in wheels 48 by using one or more types of radiographic imaging techniques. If an intruder was able to determine, through radiographic imaging, the position of notches 52 in wheels 48 of locking mechanism 41, the intruder would be able to gain access to the storage compartment 60.

In another form, storage device 40 includes a plurality of walls 70 that define storage compartment 60. As readily apparent, storage device 40 includes a front wall, a back wall, side walls, a top wall, and a bottom wall that define the enclosed storage compartment 60. In one form, walls 70 of storage device 40 include a first layer of radiographic cloaking material 32 and a second layer of radiographic cloaking material 34. In some instances, instead of gaining access to the contents of storage compartment 60, it may be the intent of an intruder to simply see what is inside of storage compartment 60. As with locking mechanism 41, the first and second layers of cloaking material 32, 34 prevent radiographic imaging of the contents of storage compartment 60 by covering and concealing the contents through the use of cloaking materials as it applies to radiographic imaging.

Figure 4:
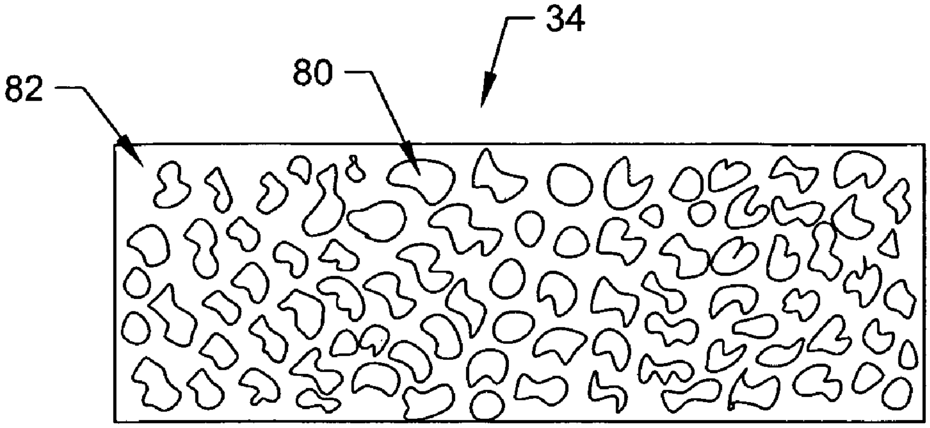
FIG. 4 illustrates a representative layer of cloaking material.

Referring to FIG. 4, a top view of a representative layer of cloaking material 34 is illustrated. In this form, in order to defeat photon beams a plurality of shards 80 of a radiation defeat material, tungsten in this example, are placed within a tungsten epoxy 82 that can then be molded to target subject 18. As illustrated, the shards 80 have many straight and irregular shaped edges, similar in size to wheels 48 (see FIG. 3) for example, and are randomly scattered throughout the layer of cloaking material 34. This configuration provides adequate obfuscation of X-ray and gamma ray radiography images.

As set forth above, other materials, such as lead or any other high density material, may also be used as may other shapes. For example, shards 80 may take the form of lead spheres, letters, or any other irregular type of shape. Other types of formable material can be used other than tungsten epoxy, such as any type of epoxy containing a high Z material.

Figure 5:
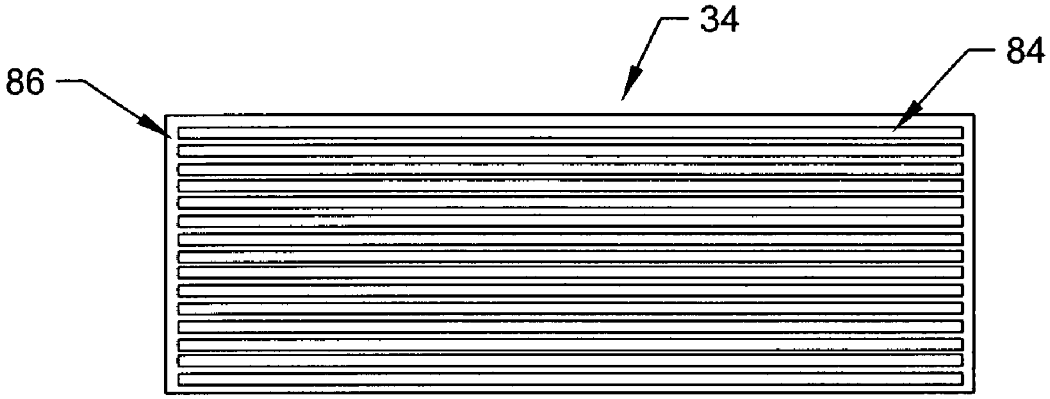
FIG. 5 illustrates another representative layer of cloaking material.
Figure 6:
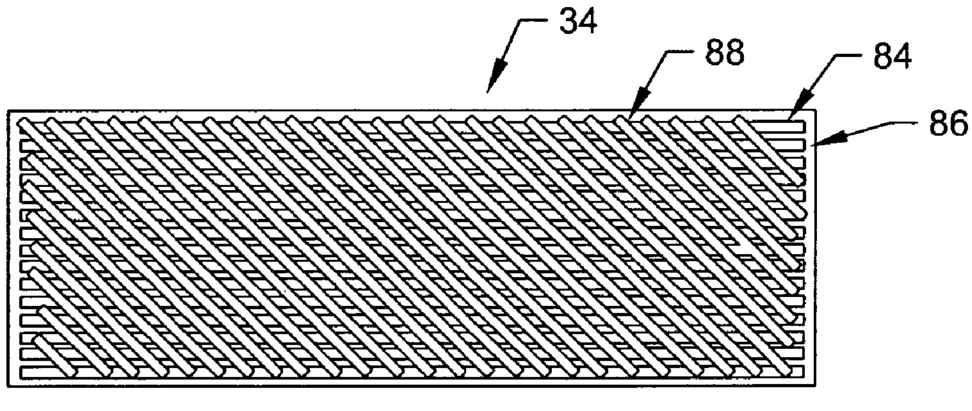
FIG. 6 illustrates yet another representative layer of cloaking material.

Referring to FIG. 5, in yet another form, a layer of cloaking material 34 can be formed by using a plurality of tungsten rods 84 that are contained within a tungsten enriched epoxy 86 (for example). The layer of cloaking material 34 is then connected with a target subject 18 at a strategic location. In one representative form, rods 84 are positioned side by side and positioned approximately one (1) millimeter apart from one another. Referring to FIG. 6, in yet another form, the layer of cloaking material 34 set forth in FIG. 5 is modified to include a second layer of tungsten rods 88 that are positioned at a predetermined angle in a direction away from tungsten rods 84. In this representative example, the second layer of tungsten rods 88 are positioned approximately 45° away from the direction of the previous layer. Although not specifically illustrated, an additional layer of tungsten rods may also be added to the embodiment illustrated in FIG. 6 at another different angular position to provide additional cloaking or concealment.

Regarding scattering of photon beams, in which backscatter detector 20 would be used by a potential intruder to produce radiographic images, materials used in connection with the first layer of cloaking material 32, the neutron absorbing layer, will cause Compton scattering to occur. This material, due to its composition, will cause backscatter detector 20 to detect the entire surface area of the first layer of cloaking material 32. As such, a false image will appear on the backscatter detector 20 thereby defeating any type of backscatter imaging from taking place. Since scattering occurs at the site of the first layer of cloaking material 32, further scattering past the first layer of cloaking material 32 will not occur, thereby effectively eliminating the ability of the backscatter detector 20 from discovering any useful information about the target subject 18.

Two different layers of cloaking material 32, 34 are utilized because cloaking material utilized to defeat particle beams generated by a particle generator 12 do not defeat photon beams generated by a photon beam generator 12. For example, neutron radiation is not sufficiently shielded by typical high-mass density materials, which are used to shield X-ray and gamma radiation. Materials that have low-mass nuclei are good for shielding against neutron radiation because the neutrons can transfer large amounts of their energy to the light nuclei through collisions (referred to as elastic collisions). The closer in mass the nucleus is to that of the neutron, the more efficient is the energy transfer. Hydrogen is the atom whose nucleus (a single proton) is closest in mass to the neutron. Thus, material with high hydrogen content is desirable for shielding against neutron beams produced by a particle generator 10.

The materials referenced herein are available in many different forms such as polymers, ceramics, powders, epoxies, and solid metals or materials. The choice of materials chosen for a respective cloaking layer can be decided as a function of the particular application for which it is intended. For example, if a highly formable material is needed then it might be best to begin with a flexible, silicon-based product as the neutron absorption layer and then use a moldable epoxy with a high concentration of tungsten powder for the gamma radiation layer. This would really be useful when retrofitting existing storage devices 40 to be secure from radiographic imaging.

In another form, the first layer of cloaking material comprises a 3/16" thick sheet of depleted uranium, a material with approximately 5 times the gamma-stopping power of lead. Because of the nature of dealing with this material, and in order to make it easy to handle, the front, back and edges of the material are clad with 1/16" to 1/8" thick tungsten alloy. In order to stop Compton Backscatter and neutron radiography, the second layer of cloaking material 34 comprises a paint made from Amerlock 400 epoxy into which is added gadolinium phosphate. When the entire composite is finished, it is wrapped around the target subject 18, effectively doubling its stopping power because a beam of radiation will have to encounter the cloaking material on at least two sides as it travels through the target subject 18.

In one form, a storage device is disclosed that includes a housing defining an interior storage compartment. A lock is installed on the housing for preventing unauthorized access to the interior storage compartment. A radiographic cloaking barrier having at least two layers of cloaking material covers at least a portion of a front surface and a back surface of a locking mechanism of the lock.

In another form, a method of protecting a storage device from radiographic imaging is disclosed that comprises covering a portion of a front surface and a back surface of a locking mechanism with a first layer of radiographic cloaking material configured to defeat a first type of radiographic beam; and covering the portion of the front and back surfaces of said locking mechanism with a second layer of radiographic cloaking material configured to defeat a second type of radiographic beam.

In yet another form, a kit for retrofitting a storage device having a lock is disclosed comprising a first radiographic cloaking barrier configured to be attached to a front surface of a locking mechanism of the mechanical lock such that the locking mechanism is at least partially cloaked from radiographic imaging; and a second radiographic cloaking barrier configured to be attached to a back surface of the locking mechanism of the lock such that the locking mechanism is at least partially cloaked from radiographic imaging.

In another form, a storage device is disclosed that includes a housing defining an interior storage compartment; and a radiographic cloaking barrier having at least two layers of cloaking material covering at least a portion of the interior storage compartment.

While the invention has been illustrated and described in detail in the drawings and foregoing description, the same is to be considered as illustrative and not restrictive in character, it being understood that only the preferred embodiments have been shown and described and that all changes and modifications that come within the spirit of the inventions are desired to be protected. It should be understood that while the use of words such as preferable, preferably, preferred or more preferred utilized in the description above indicate that the feature so described may be more desirable, it nonetheless may not be necessary and embodiments lacking the same may be contemplated as within the scope of the invention, the scope being defined by the claims that follow. In reading the claims, it is intended that when words such as “a,” “an,” “at least one,” or “at least one portion” are used there is no intention to limit the claim to only one item unless specifically stated to the contrary in the claim. When the language “at least a portion” and/or “a portion” is used the item can include a portion and/or the entire item unless specifically stated to the contrary.

What is claimed is:

1. A storage device, comprising:

a housing defining an interior storage compartment;

a lock installed on said housing for preventing unauthorized access to said interior storage compartment; and a radiographic cloaking barrier having at least two layers of cloaking material covering at least a portion of a front surface and a back surface of a locking mechanism of said lock.

2. The storage device of claim 1, where said radiographic cloaking barrier comprises at least in part a material having a high atomic number.

3. The storage device of claim 1, where said first layer of cloaking material comprises material configured to defeat a first type of radiographic beam and said second layer of cloaking material is configured to defeat a second type of radiographic beam.

4. The storage device of claim 3, where said first layer of cloaking material is configured to absorb neutrons from a particle beam generator.

5. The storage device of claim 4, where said first layer of cloaking material comprises a material having a high concentration of hydrogen and boron.

6. The storage device of claim 3, where said second layer of cloaking material is configured to attenuate gamma radiation from a photon beam generator.

7. The storage device of claim 6, where said second layer of cloaking material has a high concentration of tungsten atoms.

8. The storage device of claim 3, where said second layer of cloaking material is configured to attenuate X-ray radiation from an X-ray beam generator.

9. The storage device of claim 1, where one of said layers of said radiographic cloaking barrier comprises shards of tungsten embedded within a suitable carrier.

10. The storage device of claim 1, further comprising a third layer of cloaking material covering at least a portion of said front surface and said back surface of said locking mechanism.

11. The storage device of claim 1, where one of said layers of said radiographic cloaking barrier comprises a first set of radiographic cloaking rods.

12. The storage device of claim 11, where said radiographic cloaking rods may be selected from a group of radiographic cloaking rods comprising tungsten rods or lead rods.

13. The storage device of claim 11, where said layer of said radiographic cloaking barrier includes a second set of radiographic cloaking rods arranged to have a different angular orientation than said first set of radiographic cloaking rods.

14. The storage device of claim 1, where said interior storage compartment is surrounded by at least one layer of radiographic cloaking material.

15. A method of protecting a storage device from radiographic imaging, comprising:

covering a portion of a front surface and a back surface of a locking mechanism with a first layer of radiographic cloaking material configured to defeat a first type of radiographic beam; and covering said portion of said front and back surfaces of said locking mechanism with a second layer of radiographic cloaking material configured to defeat a second type of radiographic beam.

16. The method of claim 15, where said first layer of radiographic cloaking material comprises a neutron absorbing material.

17. The method of claim 15, where said first layer of radiographic cloaking material comprises a layer of photon beam attenuating material.

18. The method of claim 15, where said first layer of radiographic cloaking material comprises a flexible silicon-based material containing a neutron absorbing material.

19. The method of claim 15, where said first layer of radiographic cloaking material comprises a neutron absorbing material and said second layer of radiographic cloaking material comprises a photon attenuating material.

20. The method of claim 19, where said neutron absorbing material comprises a material composed of a high concentration of hydrogen and said second layer of radiographic cloaking material comprises a material composed of a high concentration of tungsten atoms.

21. The method of claim 15, where said first layer of cloaking material comprises shards of tungsten within a suitable carrier.

22. The method of claim 15, where said first layer of cloaking material comprises a material configured to cause beam scattering.

23. A kit for retrofitting a storage device having a lock, comprising:

a first radiographic cloaking barrier configured to be attached to a front surface of a locking mechanism of said lock such that said locking mechanism is at least partially cloaked from radiographic imaging; and a second radiographic cloaking barrier configured to be attached to a back surface of said locking mechanism of said lock such that said locking mechanism is at least partially cloaked from radiographic imaging.

24. The kit of claim 23, further comprising a third radiographic cloaking member configured to be attached an upper side surface of said locking mechanism of said lock such that said locking mechanism is at least partially cloaked from radiographic imaging.

25. The kit of claim 24, further comprising a fourth radiographic cloaking member configured to be attached a lower surface of said locking mechanism of said lock such that said locking mechanism is partially cloaked from radiographic imaging.

26. The kit of claim 25, further comprising a fifth radiographic cloaking member configured to be attached a left side surface of said locking mechanism of said lock such that said locking mechanism is partially cloaked from radiographic imaging.

27. The kit of claim 26, further comprising a sixth radiographic cloaking member configured to be attached a right side surface of said locking mechanism of said lock such that said locking mechanism is partially cloaked from radiographic imaging.

28. The kit of claim 23, where said first and second radiographic cloaking barriers comprise flex boron in polymer with tungsten chips.

29. The kit of claim 23, where said first and second radiographic cloaking barriers comprise lead balls suspended in a suitable medium.

30. The kit of claim 23, where said first and second radiographic cloaking barriers include a plurality of tungsten rods covered with an epoxy.

31. The kit of claim 23, where said first and second radiographic cloaking barriers comprise a first set of tungsten rods having a first predetermined orientation and a second set of tungsten rods having a second predetermined orientation in relation to said first set of tungsten rods.

32. The kit of claim 23, where said first and second radiographic cloaking members comprise housings filled with a fluid.

33. A storage device, comprising:

a housing defining an interior storage compartment; and a radiographic cloaking barrier having at least two layers of cloaking material covering at least a portion of the interior storage compartment.

* * * * *